(12) United States Patent
Yotsuya et al.

(10) Patent No.: US 7,976,633 B2
(45) Date of Patent: Jul. 12, 2011

(54) DEVICE AND METHOD OF FORMING FILM

(75) Inventors: Shinichi Yotsuya, Chino (JP); Shinji Kanemaru, Chino (JP)

(73) Assignee: Seiko Epson Corporation (JP)

( * ) Notice: Subject to any disclaimer, the term of this patent is extended or adjusted under 35 U.S.C. 154(b) by 829 days.

(21) Appl. No.: 11/326,906

(22) Filed: Jan. 6, 2006

(65) Prior Publication Data
US 2006/0160026 A1 Jul. 20, 2006

(30) Foreign Application Priority Data
Jan. 20, 2005 (JP) .................. 2005-012401

(51) Int. Cl.
C23C 16/00 (2006.01)

(52) U.S. Cl. .................. 118/721; 118/715; 118/504

(58) Field of Classification Search .......... 118/721, 118/504, 715
See application file for complete search history.

(56) References Cited

U.S. PATENT DOCUMENTS

| | | | | | |
|---|---|---|---|---|---|
| 3,661,567 | A | * | 5/1972 | Yamamoto | 420/434 |
| 4,599,970 | A | * | 7/1986 | Peterson | 118/504 |
| 4,615,781 | A | * | 10/1986 | Boudreau | 427/96.8 |
| 4,733,271 | A | | 3/1988 | Arai | |
| 6,259,174 | B1 | * | 7/2001 | Ono | 310/13 |
| 6,271,469 | B1 | * | 8/2001 | Ma et al. | 174/521 |
| 6,852,356 | B2 | * | 2/2005 | Nishikawa | 427/64 |
| 6,875,542 | B2 | | 4/2005 | Yotsuya | |
| 7,097,750 | B2 | * | 8/2006 | Kang et al. | 204/298.11 |
| 2002/0059903 | A1 | * | 5/2002 | Hasegawa et al. | 118/504 |
| 2002/0162998 | A1 | * | 11/2002 | Okuda et al. | 257/59 |
| 2004/0137147 | A1 | * | 7/2004 | O'Donnell et al. | 427/255.38 |
| 2006/0049044 | A1 | * | 3/2006 | Seddon | 204/298.23 |
| 2006/0086321 | A1 | * | 4/2006 | Brody et al. | 118/720 |
| 2009/0074952 | A1 | * | 3/2009 | Yamazaki et al. | 427/70 |

FOREIGN PATENT DOCUMENTS

| | | |
|---|---|---|
| JP | 54-124052 | 2/1978 |
| JP | 59-056579 | 4/1984 |
| JP | 61-249795 | 11/1986 |
| JP | 62-202491 | 9/1987 |
| JP | 10-041069 | 2/1998 |
| JP | 2001-237073 | 8/2001 |
| JP | 2002-047560 | 2/2002 |
| JP | 2002-296562 | * 10/2002 |
| JP | 2003-100460 | 4/2003 |
| JP | 2003-231961 | 8/2003 |

OTHER PUBLICATIONS

Communication from Korea Patent Office regarding counterpart application.

* cited by examiner

*Primary Examiner* — Ram N Kackar
*Assistant Examiner* — Satish Chandra
(74) *Attorney, Agent, or Firm* — Harness, Dickey & Pierce, P.L.C.

(57) ABSTRACT

A film forming device includes a mask member that is made of silicon and has first openings of predetermined patterns; a magnetic member that is made of a magnetic material and has a second opening, and that is aligned with the mask member so that the first openings are arranged in the second opening in plan view of the second opening; and a substrate holding member that generates magnetic force between the magnetic member and itself in order to adhere the mask member and a substrate to each other. The mask member and the substrate are interposed between the magnetic member and the substrate holding member in this order from the magnetic member.

2 Claims, 3 Drawing Sheets

DEVICE AND METHOD OF FORMING FILM

BACKGROUND

1. Technical Field

The present invention relates to a device and a method of forming a film capable of properly forming a predetermined film pattern on a large-sized substrate.

2. Related Art

Conventionally, methods using a photolithographic technique and a dry or wet etching technique have been used for forming wiring lines on a substrate. However, since equipment for the photolithograph and the etching is expensive, and a large amount of money is required to invest in the equipment. Further, since the methods have a long process and a number of control items, cost increase is inevitable in terms of yielding percentage and management. In addition, since a large quantity of resist, resist developing liquid, resist peeling liquid, etching liquid (etching gas) are required in manufacturing, waste liquid (waste gas) resulting from these liquid may harm environment. In case that holes or grooves are formed in a substrate, covering a resist is difficult to achieve, whereby it is difficult to form a pattern having a high density. To solve the above-described problems, a method of forming a film by using a mask has been proposed (for example, see JP-A-10-41069).

In the method of forming a film disclosed in JP-A-10-41069, a mask is made of a ferromagnetic material, and the mask is brought into close contact with a substrate by a magnetic force. However, since the ferromagnetic material can be manufactured with a lower accuracy than a silicon material, a mask for forming complex film patterns such as circuit wiring lines cannot be obtained.

SUMMARY

An advantage of the invention is that it provides a device and a method of forming a mask capable of reliably obtaining a complex film pattern.

In order to solve the above-mentioned problem, according to an aspect of the invention, a film forming device includes a mask member that is made of silicon and has first openings of predetermined patterns; a magnetic member that is made of a magnetic material and has a second opening, and that is aligned with the mask member so that the first openings are arranged in the second opening in plan view of the second opening; and a substrate holding member that generates magnetic force between the magnetic member and itself in order to adhere the mask member and a substrate to each other. The mask member and the substrate are interposed between the magnetic member and the substrate holding member in this order from the magnetic member.

According to the film forming device, the mask member having first openings of predetermined patterns and a substrate on which film patterns are to be formed are interposed between the substrate holding member and the magnetic member, and the mask member and the substrate are adhered to each other by the magnetic force so as to be in a close contact state. Therefore, it is possible to prevent a gap due to a bend by their own weight from occurring between the mask member and the substrate. In addition, since opening patterns are formed on a mask made of silicon which can be easily manufactured, it is possible to form complex opening patterns which cannot be easily formed on metal materials.

In the film forming device according to the aspect of the invention, the magnetic member may be formed in a frame shape in plan view. In this case, the mask member and the substrate can be interposed between the magnetic member and the substrate holding member at the periphery of the mask member.

In the film forming device, the magnetic member may be formed so as to include beams formed between frame-like parts. In this case, it is possible to effectively prevent or suppress the magnetic member from being bent due to its own weight. In addition, since the mask member and the substrate can be interposed between a beam part of the magnetic member in which the periphery is excluded and the substrate holding member, the adhesiveness between the mask member and the substrate can be further improved.

Furthermore, the magnetic member may be formed so as to have a mesh structure. According to the magnetic member having the mesh structure, the adhesiveness between a mesh part of the mask member and the substrate can be further improved, and film forming materials can reliably pass through the mask member.

In the film forming device, the substrate holding member may be made of a permanent magnet. With this permanent magnet, the mask member and the substrate can be reliably brought into close contact with each other, between the substrate holding member and the magnetic member.

In the film forming device, a protective film or a protective member made of a silicon material may be formed on the surface of the magnetic member opposite to the surface of the magnetic member facing the mask member. In this case, since film forming materials are not directly adhered to the magnetic member, the magnetic member can be recycled, the improving the life time of the film forming device.

In the film forming device, the mask member may have the first openings, and beams on the mask side which connect an area inserted in the first openings and an area except for the area inserted in the first opening. In this case, as the beams on the mask side connect an area inserted in the first opening and an area except for the area inserted in the first opening, it is possible to form opening patterns having a complex shape. To be more specific, it is possible to form opening patterns in a closed shape, and to form film patterns having a continuous shape without division on the substrate. In the film forming device, since the adhesiveness between the mask member and the substrate is improved by a magnetic force, desired film patterns can be reliably formed even when the mask having such a complex shape is adopted. In addition, according to the aspect of the invention, the beams on the mask side are formed thinner than the other areas except for the beams. In this case, film forming substance which enters at an angle can be adhered onto the substrate.

The mask member having the above-described beams on the mask side can be manufactured as to be described below. That is, the process of manufacturing the mask member (method of manufacturing the mask member) includes a first process and a second process. In the first process, etching treatment is performed on an area except for the beam forming area which divides the opening forming area into plural sections, in a silicon base material where the first opening is formed. In the second process, etching treatment is performed over the whole opening forming area in the same direction as that of the first process.

In this case, the mask member having the beams which are separated at a predetermined distance from the surface of the base material and connect side walls of the first openings can be easily and reliably manufactured. Further, in a third process, in which etching treatment is performed in the opposite direction to that of the first and second process so as to form a mask on the base material through the openings, the thickness and the strength of the mask member can be properly adjusted. In addition, if the etching treatment in the first and second process is anisotropic etching treatment, the openings including the beams can be reliably formed.

Next, in order to solve the above-mentioned problem, according to another aspect of the invention, a method of forming a film by using a mask, which includes a mask member that is made of silicon and has first openings of a predetermined pattern; and a magnetic member that is made of a magnetic material and has a second opening, and that is aligned with the mask member so that the first openings are arranged in the second opening in plan view of the second opening, is provided. In this case, while the mask member and a substrate are interposed between the magnetic member and a substrate holding member in this order from the magnetic member by a substrate holding member generating magnetic force between the magnetic member and itself, a film is formed on the substrate through the mask member.

According to the method of forming a film, the mask member having the first openings with a predetermined pattern and a substrate on which film is to be formed are inserted between the substrate holding member and the magnetic member, and the mask member and the substrate are adhered to each other by the magnetic force so as to be in a close contact state. Therefore, it is possible to prevent a gap due to a bend by their own weight from occurring between the mask member and the substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
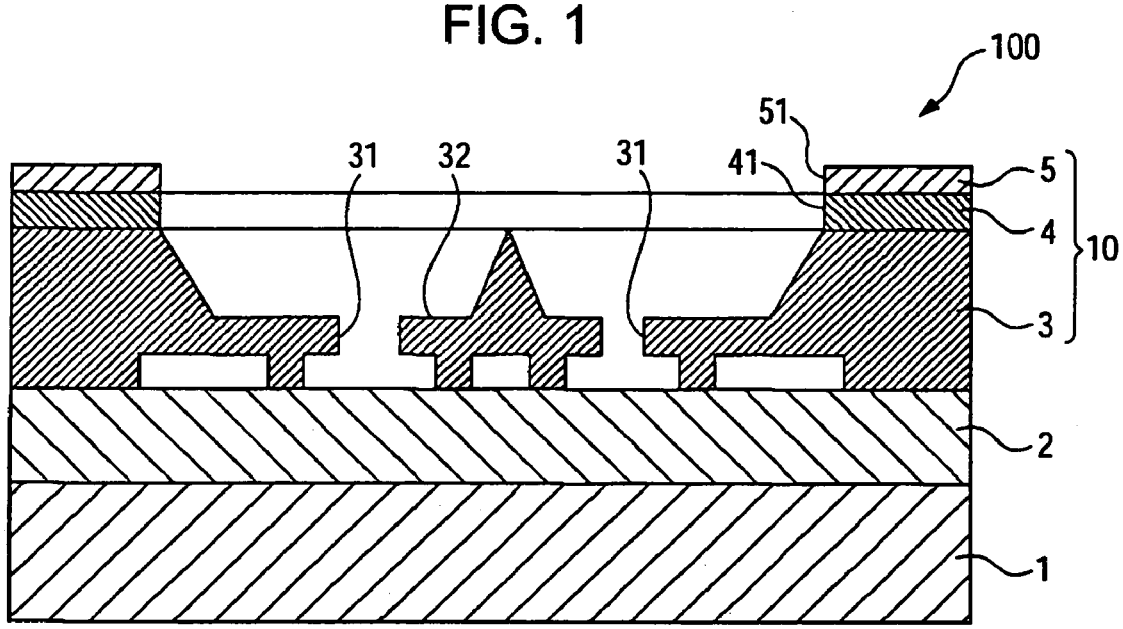
FIG. 1 is a cross-sectional view schematically showing a film forming device according to an embodiment of the invention.

Hereinafter, a device and a method of forming a film of the invention will be described with reference to the accompanying drawings. Respective layers and members are differently scaled in each drawing, in order to make the respective layers and members perceivable in the drawings.

Figure 2:
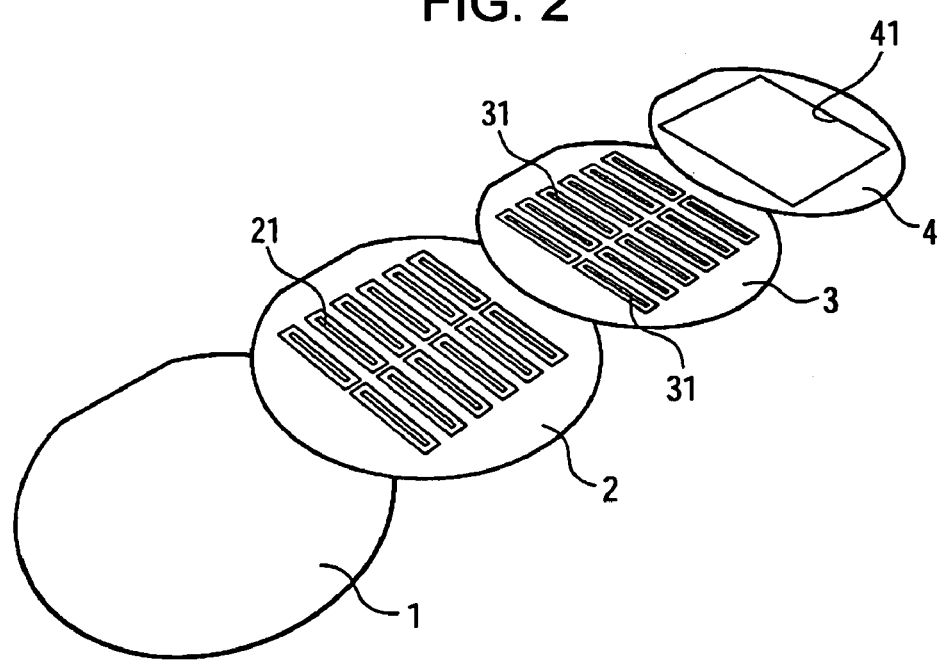
FIG. 2 is an exploded perspective view showing the film forming device of FIG. 1.

FIG. 1 is a cross-sectional view schematically showing a film forming device according to an embodiment of the invention. FIG. 2 is an exploded perspective view showing the film forming device shown in FIG. 1.

A film forming device 100 of the present embodiment is composed of a mask main body 10 and a sheet-like magnet (substrate holding member) 1 for adhering a substrate 2, on which a film is formed, closely to the mask main body 10. The film forming device 100 is a device for forming a film pattern on the substrate by using a deposition method, a sputtering method, and a CVD (chemical vapor deposition) method.

The mask main body 10 is composed of a silicon mask (mask member) 3, a metal member (magnetic member) 4, and a protective film 5. The mask is configured so that a material for forming a film passes therethrough along a predetermined pattern.

The silicon mask 3 is formed of a silicon substrate having a mirrored surface with thickness of 400 μm, and includes a plurality of openings 31. The plurality of openings 31 have opening patterns modeled after an arrangement and shape of the film pattern, with respect to the film pattern (flat pattern) to be formed.

The metal member 4 is made of a stainless material (magnetic material) having a thickness in the range of 0.1 mm to 0.2 mm. The metal member 4 is formed in a frame shape having one opening 41 in plan view. The metal member 4 is aligned with the silicon mask 3 such that the plurality of openings 31 formed in the silicon mask 3 is positioned inside the opening 41. It is preferable to make the metal member 4 thinner so that film forming substance easily form films under beams during the formation of a film. In the above-described thickness range, there is no chance that the thickness of the film becomes thinner due to blockage of the film formed forming.

The protective film or protective member 5 is made of a silicon material, and is formed to cover the surface of the metal member 4. That is, the protective film 5 has an opening 51 that communicates with the opening 41 and is formed in the same shape as the opening 41 so as to be coaxial therewith.

With this construction, since the film forming substance is prevented from being directly adhered to the magnetic member, the magnetic member can be recycled.

In the meantime, the silicon mask 3 and the substrate 2 are interposed between the metal member 4 of the mask main body 10 and the sheet-like magnet 1 in this order from the metal member 4, and the sheet-like magnet 1 generates magnetic force between the sheet-like magnet 1 and the metal member 4. Further, the silicon mask 3 and the substrate 2 are adhered to the sheet-like magnet 1 by the magnetic force, so that the silicon mask 3 is brought into close contact with the substrate 2. The substrate 2 is made of a silicon material, and the sheet-like magnet 1 is formed with a slightly smaller size than the substrate 2 in this embodiment.

According to the film forming device 100 having the above-described construction, the silicon mask 3 and the substrate 2, which are interposed between the metal member 4 and the sheet-like magnet 1, can be reliably in close contact with each other. According to the method of forming a film of the invention in which a film is formed on the substrate through the silicon mask 3 while the silicon mask 3 and the substrate 2 are interposed in a close contact state by the magnetic force between the metal member 4 and the sheet-like magnet 1, the substrate 2 and the silicon mask 3 can be prevented from being bent, and moreover, it is possible to effectively prevent a gap from occurring between the silicon mask 3 and the substrate 2 even if bend occurs.

Figure 5:
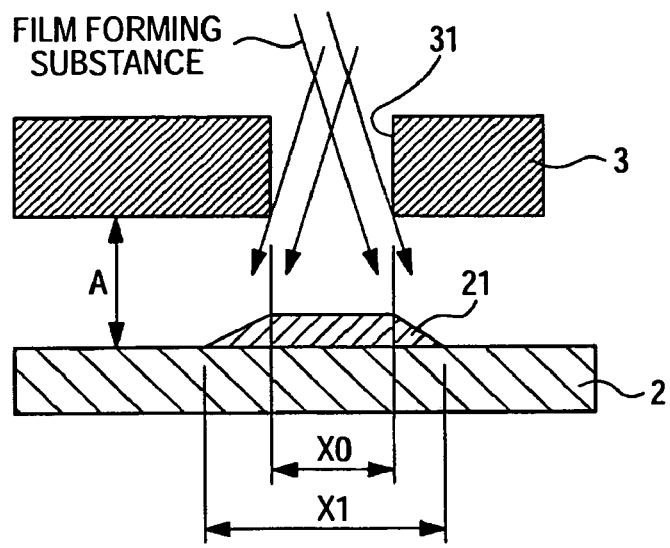
FIG. 5 is an explanatory view showing a state in which a pattern is blurred.

Here, when the silicon mask 3 is not sufficiently brought into close contact with the substrate 2, as shown in FIG. 5, a gap A occurs between the silicon mask 3 and the substrate 2. When this gap A occurs, the film forming substance under the beam 3 by the substance that invaded obliquely. As a result, a width X1 of a formed film pattern is larger than a width X0 of an opening of the silicon mask 3, so that a blur of the pattern ΔX occurs. However, in this embodiment as described above, since the gap A can be effectively prevented, the blur of the pattern ΔX is prevented, whereby a desired film pattern can be reliably formed.

Here, with the film forming device 100 in this embodiment, aluminum wiring lines are formed in a film thickness of 8500 Å by DC sputtering. Consequently, the phenomenon that makes the film pattern blurred can be removed and a minimum space between the wiring lines can be ensured up to 17 μm in this embodiment, in contrast to a film forming device which does not have the above-described close contact structure formed by a magnetic force.

Hereinafter, the construction of the silicon mask 3 and the method of manufacturing the silicon mask 3 will be described in detail.

The silicon mask 3 is a silicon substrate in which the plurality of openings 31 are formed. The opening 31 is formed in a line shape having a width of, for example, 10 μm. By laminating conductive metal materials such as aluminum the substrate 2 through the opening 31, patterns such as electric wiring lines having a width of about 10 μm can be formed. The shape of the opening 31 is not limited to a line shape, and it may be a circular and a rectangular shape.

Here, a plurality of beams 32, which connect side walls of the opening 31, is provided in the respective openings 31. The beam 32 is provided in a position separated from a surface of the silicon mask 3 facing the substrate 2. The distance between the substrate 2 and the surface of the silicon mask 3 facing the substrate 2 is at least 5 μm or more. In this way, since the plurality of beams 32 is provided on the side wall of the opening 31, the opening 31 can be stably formed in a closed shape in the silicon mask 3. For example, by supporting island shaped floating portions with the plurality of the beams 32, the opening 31 formed in a donut shape can be provided. As a result, the island shaped portions are prevented from being separated from the silicon mask 3 so as to be integrally formed with the silicon mask 3, thus forming a complete mask.

The reason why the beam 32 is provided in a position separate from the surface facing the substrate 2 is that metal wiring lines need to be continuously formed without division when the metal wiring lines are formed on the substrate 2 by using the silicon mask 3. Eventually, by separating the beam 32 from the surface facing the substrate 2, materials for metal wiring lines connect to under the both sides of the beam 32 so as to be adhered onto the substrate. Even when the silicon mask 3 having such a complex construction is used, as described above, adhesiveness between the silicon mask 3 and the substrate 2 is improved by a magnetic force between the metal member 4 and the sheet-like magnet 1 in this embodiment. Accordingly, the complex wiring lines can be formed with a high density.

Further, the above-described silicon mask can be manufactured by the following method.

First, an oxide film ($SiO_2$ film) to be used as an anti-dry etching mask is formed over the entire surface of a base material (silicon substrate) that is to be the silicon mask 3. As materials for forming a film, any material that serves as a mask in performing anisotropic etching treatment to be described below can be used. Accordingly, for example, materials such as silicon nitride, carbonized silicon, aluminum, and chrome may be used as the materials for forming a film. As the method for forming a film, deposition method, sputtering method, coating method, and CVD (Chemical Vapor Deposition) may be adopted. Further, by using photolithographic technique, an area corresponding to the opening 31 to be formed is removed from the oxide film formed on the surface of the base material. That is, an area on the surface of the base material, which is exposed by removing the oxide film, becomes the opening 31.

Next, a resist is coated on the base material, and then an area corresponding to the opening 31 including the beam 32 is removed from the resist coated on the surface of the base material by using the photolithographic technique. That is, among an area, which is exposed in the preceding process, where the opening 31 is formed, a resist is arranged in an area (beam forming area) where the beam 32 is formed. Accordingly, the area where the opening 31 is formed (opening forming area) is exposed as if the area is divided into plural sections. Next, the anisotropic etching treatment is performed on the base material. The anisotropic etching treatment is a treatment that performs etching in a specific direction, that is, in a direction substantially orthogonal to the surface of the base material. Then, silicon is uniformly removed to a predetermined depth. That is, among an area where the opening 31 is formed, silicon is removed from an area (except for the beam forming area from the opening forming area) where the beam 32 does not exist.

Next, the resist coated on the base material is peeled off by using oxygen plasma. Then, the anisotropic etching treatment is performed again on the base material from which the resist is peeled off. Accordingly, silicon is uniformly and more deeply removed in an area where silicon is removed by the etching treatment of the preceding process. Further, among an area where a resist is peeled off, silicon is uniformly removed as well in an area where an oxide film does not exist. In this way, two stages of concavity and convexity is formed. An area from which silicon is newly removed in this process is an area where the beam 32 is formed (beam forming area), and the silicon is removed from the surface of the base material to a predetermined depth. That is, the depth to which the silicon is removed by the anisotropic etching treatment is the distance from the surface of the base material to the beam 32.

Next, the oxide film formed on the base material is peeled off, and an oxide film is formed again over the entire surface of the base material. By using the photolithographic technique, among the oxide film formed on the rear surface of the base material, an area except for the periphery of the base material is removed. In other words, the central portion of the base material is exposed. Then, wet etching treatment is performed on the base material, and silicon in an area except for the periphery of the base material is uniformly removed to a predetermined depth. In this case, anisotropic etching treatment (dry etching treatment) can be performed as well as the wet etching treatment. Lastly, by peeling off the oxide film formed on the base material, the plurality of openings 31 is formed in the base material, whereby the silicon mask 3 shown in FIGS. 1 and 2 is manufactured.

Figure 3:
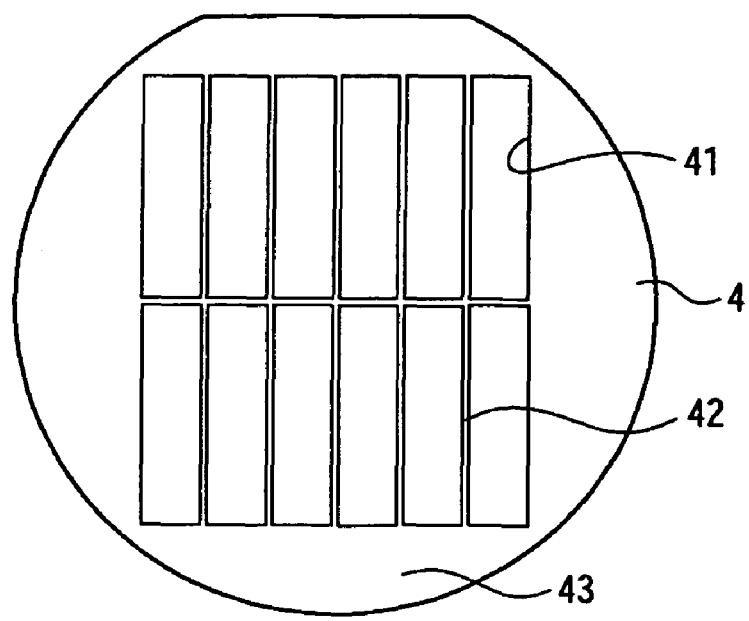
FIG. 3 is a plan view showing a metal member according to one modification.

In the meantime, the metal member 4 may be provided with beams 42 shown in FIG. 3 by using the film forming device 100 according to this embodiment. That is, as the metal member 4, which includes frame-like parts 43 and the beams 42 formed between frame-like parts 43, is adopted, it is possible to ensure the strength of the metal member and to improve adhesiveness between the silicon mask 3 and the substrate 2 that are interposed between the metal member and the sheet-like magnet 1. In addition, it is preferable to adopt the beams 42, for example, when a plurality of predetermined film pattern (wiring pattern) units is provided on the substrate 2. That is, when the beams 42 are formed corresponding to non-film forming parts that are formed between the film pattern units to be formed, there is rare chance that the beams 42 hinder film forming.

Figure 4:
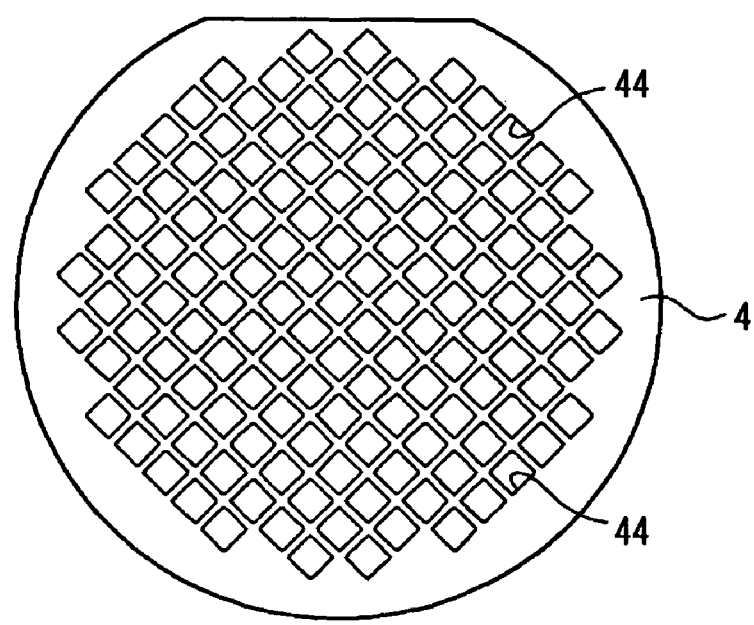
FIG. 4 is a plan view showing a metal member according to one modification.

In addition, for example, the metal member 4 may has a mesh structure having a plurality of micropores 44 shown in FIG. 4. Even in this case, it is possible to ensure the strength of the metal-member, and to improve the adhesiveness between the silicon mask 3 and the substrate 2 that are interposed between the metal member and the sheet-like magnet 1.

Figure 6:
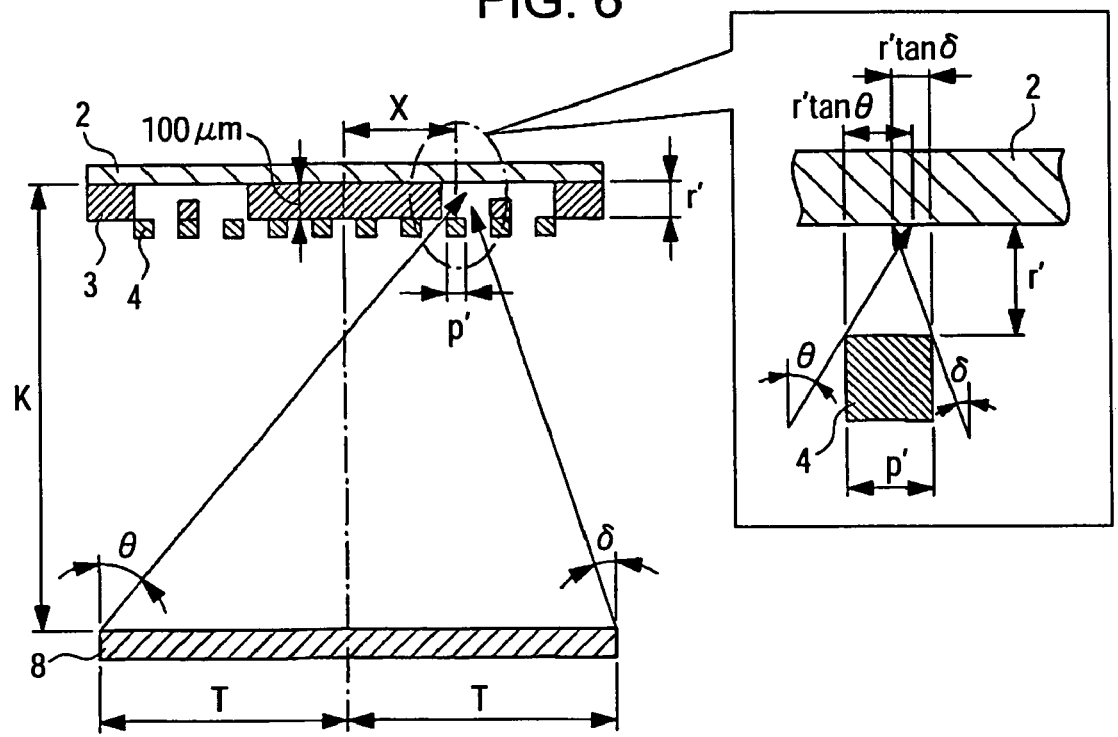
FIG. 6 is an explanatory view showing a mesh structure when the metal member of FIG. 4 is used.

Hereinafter, dimensions design of mesh parts, in case that the mesh structure is adopted, will be described. FIG. 6 shows a positional relation among a target 8, the metal member 4, the silicon mask 3, and the substrate 2, when film forming is performed by the sputtering method using the mask. Assuming that p' indicates the width of the mesh and r' indicates the distance between the metal member 4 and the substrate 2, it is preferable to satisfy a relation (p'/r')<(2T/K) from the following geometric relations, in order to remove a shadow of the mesh.

(Geometric Relations)

$$p' < (r' \tan\theta + r' \tan\delta) \quad (1)$$

$$p' < (r'((T+x)/K + (T-x)/K)) \quad (2)$$

$$p' < (r'(2T/K)) \quad (3)$$

$$(p'/r') < (2T/K) \quad (4)$$

Therefore, it is preferable that the ratio of p' and r' be smaller than the ratio of a target diameter 2T and a distance K between the target of a sputtering device and the substrate. It is possible to define dimensions of the mesh by substituting a target diameter of a sputtering device to be used in mask sputtering and a distance between a target and a source for the expression (4).

As described above, the device and the method of forming a film according to the embodiment of the invention has been described. However, the invention is not limited to the embodiment. In addition, the device and the method of forming a film are applicable in forming pixel patterns of electro-optic devices such as organic EL devices or liquid crystal devices during the formation of the wiring patterns.

What is claimed is:

1. A film forming device for forming a film from a film forming material on a substrate, comprising:

a silicon mask member including a first major surface, a second major surface opposite the first major surface, and having a plurality of first openings that form a predetermined pattern;

a magnetic member directly contacting the first major surface of the silicon mask member, the magnetic member including a plurality of second openings that are aligned with the first openings of the mask member, each of the plurality of second openings being separated by beams coupled to a frame that surrounds the plurality of second opening;

a silicon protective film or a silicon protective member disposed on a surface of the magnetic member opposite the first major surface of the silicon mask member, the silicon protective film or silicon protective member having a plurality of third openings connected to the second openings such that dimensions of the third openings match dimensions of the second opening, and the protective film preventing the film forming material from contacting the magnetic member; and a substrate holding member disposed proximate the second major surface of the silicon mask member such that the substrate is disposed directly between the substrate holding member and the silicon mask member, the substrate holding member being formed of a permanent magnetic material that magnetically attracts the magnetic member to thereby hold the substrate directly between the silicon mask member and itself.

2. The film forming device according to claim 1, wherein the magnetic member is formed so as to have a mesh structure.

* * * * *